United States Patent [19]
Oowaki et al.

[11] Patent Number: 5,684,746
[45] Date of Patent: Nov. 4, 1997

[54] SEMICONDUCTOR MEMORY DEVICE IN WHICH A FAILED MEMORY CELL IS PLACED WITH ANOTHER MEMORY CELL

[75] Inventors: Yukihito Oowaki; Ryo Fukuda, both of Yokohama, Japan

[73] Assignee: Kabushiki Kaisha Toshiba, Kawasaki, Japan

[21] Appl. No.: 567,688

[22] Filed: Dec. 5, 1995

[30] Foreign Application Priority Data

Dec. 7, 1994 [JP] Japan .................................. 6-304040

[51] Int. Cl.$^6$ .................................................. G11C 7/00
[52] U.S. Cl. ........................................ 365/200; 365/201
[58] Field of Search ............................ 365/200, 201, 365/230.01

[56] References Cited

U.S. PATENT DOCUMENTS 5,267,205  11/1993  Hamada ................................. 365/200

OTHER PUBLICATIONS

"A Flexible Redundancy Technique For High–Density DRAM'S", Masashi Horiguchi, et al. IEEE Journal Of Solid–State Circuits vol. 26, No. 1, pp. 12–17, Jan. 1991.
"A 7–ns 1–Mb BiCMOS ECL SRAM With Shift Redundancy," Atsushi Ohba, et al. IEEE Journal Of Solid–State Circuits vol. 26, No. 4, pp. 507–511, Apr. 1991.

Primary Examiner—David C. Nelms
Assistant Examiner—F. Niranjan
Attorney, Agent, or Firm—Oblon, Spivak, McClelland, Maier & Neustadt, P.C.

[57] ABSTRACT

A semiconductor memory device including a memory cell array having memory cells arranged in XY directions, means for storing at least X addresses of failure bit memory cells among memory cells defined by an X address and a Y address in the memory cell array, and address means for generating an address Xe+m (m=positive or negative integer), serving as an internal address, when X address Xe corresponding to the failure bit address is inputted from an external section.

15 Claims, 7 Drawing Sheets

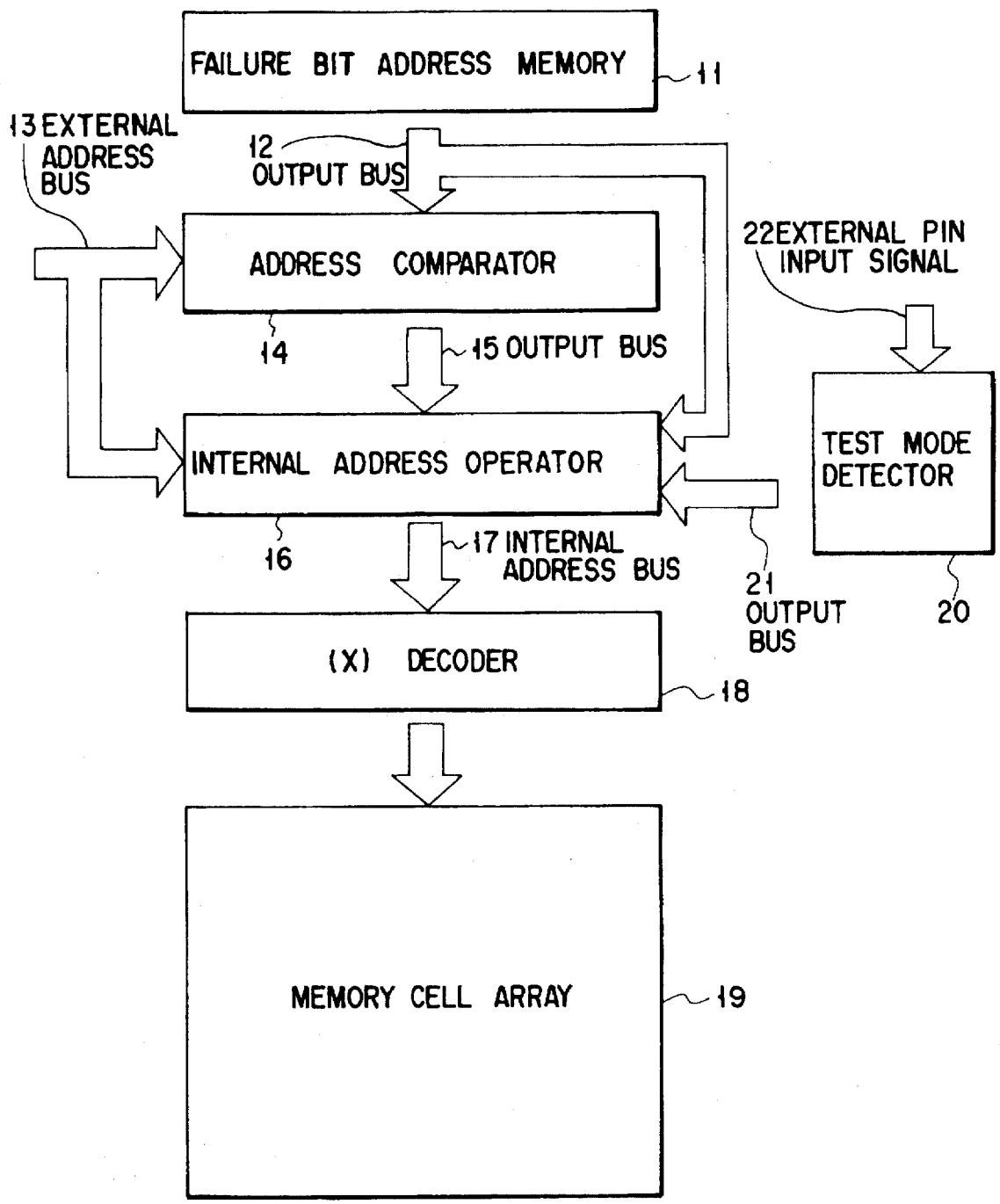
F I G. 2

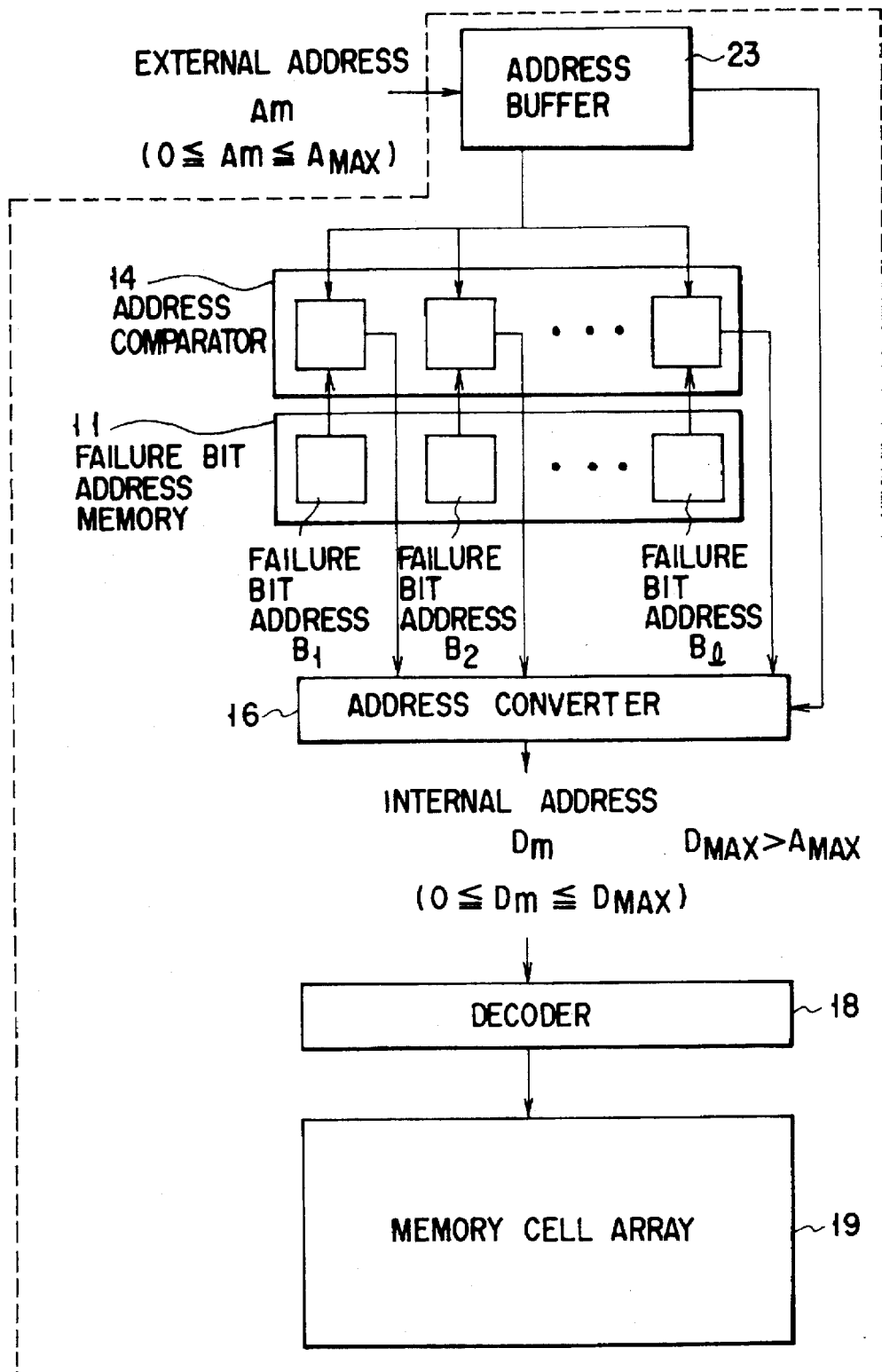
F I G. 5

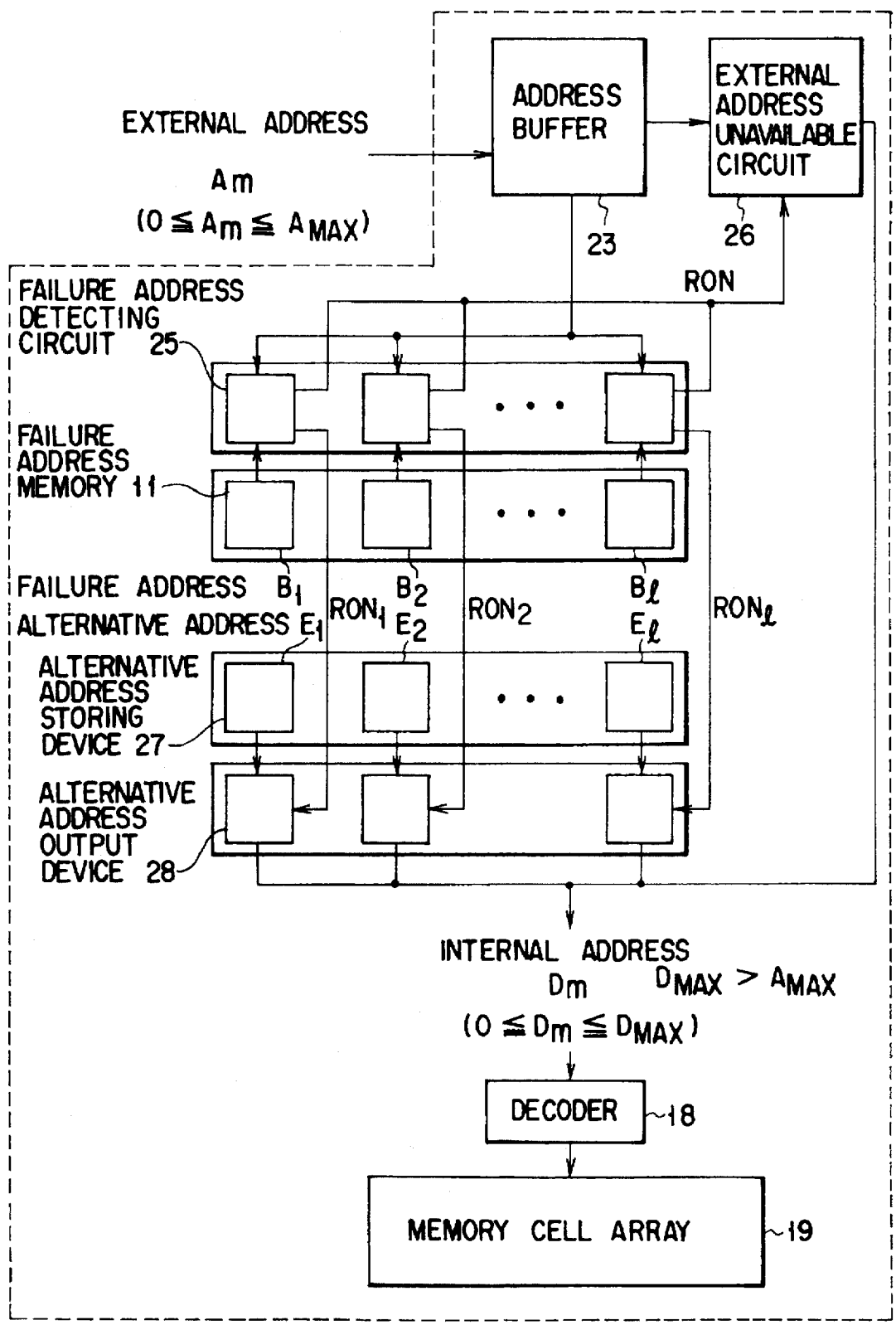
F I G. 10

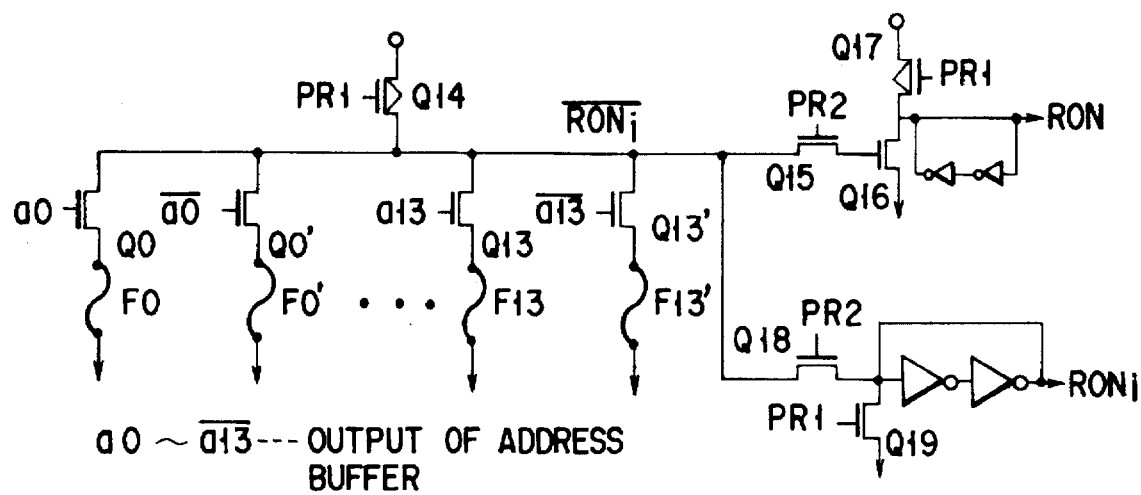
F I G. 11
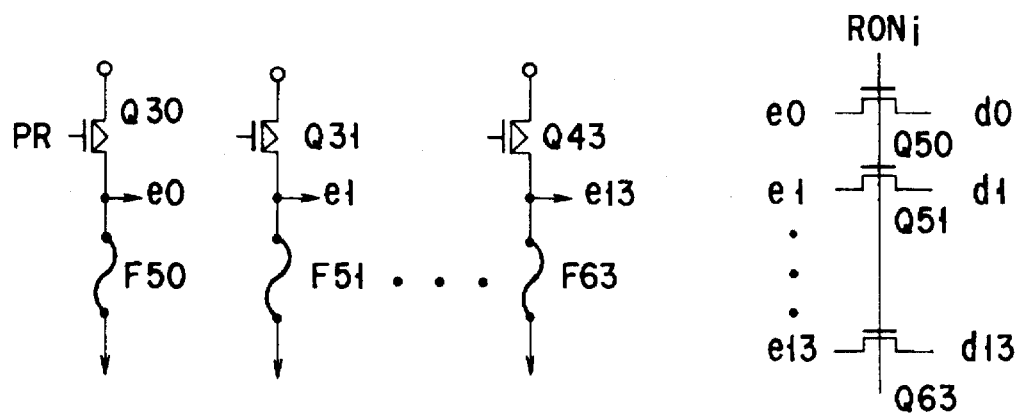
F I G. 12
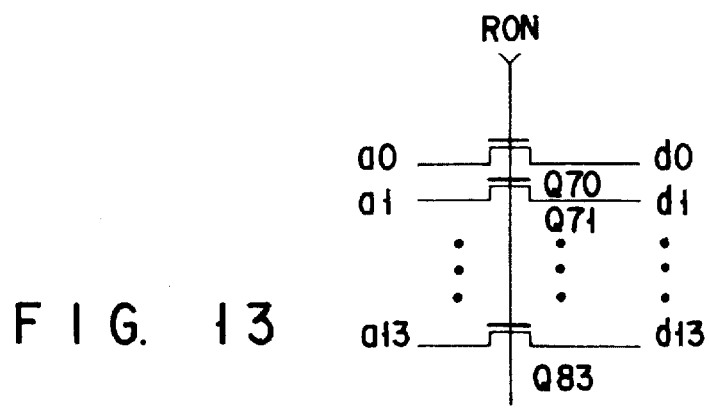
F I G. 13

SEMICONDUCTOR MEMORY DEVICE IN WHICH A FAILED MEMORY CELL IS PLACED WITH ANOTHER MEMORY CELL

BACKGROUND OF THE INVENTION

1. Field of the Invention

The present invention relates to a semiconductor memory device comprising a memory cell array having a plurality of memory cells are arranged in an array form, and more particularly to a semiconductor memory device comprising a failure bit saving function.

2. Description of the Related Art

In the memory cell array in which memory cells are arranged in a matrix form, it is extremely difficult to form all bits (memory cells) without any failure. Due to this, it is necessary to provide the so-called failure bit saving in which a memory cell having failure is replaced with a memory cell, which is separately prepared.

Conventionally, there is known the structure shown in FIG. 1 as a typical failure memory saving system. In FIG. 1, there are provided a main memory cell array 1, a redundant memory cell 2, a decoder 3 for the main memory cell array side, a decoder 4 for selecting the redundant memory cell array side, a redundant fuse 5, and a control circuit 6.

According to the above system, the plurality of memory cells is divided to a memory matrix. Then, in the memory matrix, the memory cell array 1 and the redundant memory cell 2 are provided. If an address is inputted from an external unit, it is checked whether or not the inputted address is a failure bit address. If the result is the failure bit address, an output from the decoder 3 for the main memory cell array 1 is maintained to be unactive, and the decoder 4 for the redundant memory cell array 2 is activated to access the redundant memory cell array 2.

However, there are two problems in the above-mentioned conventional system as follows.

More specifically, first, it is impossible to test failure of the redundant memory cell array 2 in advance. Due to this, even if the failure bit of the main memory cell array 1 is replaced with the redundant memory cell, there occurs a case in which the failure bit of the main memory cell array 1 is replaced with a failure redundant memory cell, and the failure bit cannot be saved.

Secondly, since the memory cell, which can be saved by the redundant memory, is only the array adjacent to the redundant memory, efficiency of saving is low.

As explained above, in the conventional semiconductor memory device, even if the failure bit is replaced with the redundant memory cell, there is the problem in which the failure bit is replaced with the failure redundant memory cell. Or, there is the problem in which the memory cell, which can be saved by the redundant memory, is only in an array adjacent to the redundant memory and efficiency of saving is low.

SUMMARY OF THE INVENTION

An object of the present invention to provide a semiconductor memory device, which can surely save failure bits without replacing with failure redundant memory cells, and which can improve failure bit saving efficiency.

The outline of the present invention lies in the points in which the redundant memory cell can be tested, and the redundant memory can be used to save a failure bit of a memory matrix, which is not always an adjacent array.

According to the first aspect of the present invention, there is provided a semiconductor memory device comprising a memory cell array having memory cells arranged in an array form in XY directions; means for storing at least X addresses of failure bit memory cells among memory cells defined by X addresses and Y addresses in the memory cell array; and addresses means for generating an address Xe+m (m=positive or negative integer), serving as an internal address, when X address Xe corresponding to the failure bit address is inputted from an external section.

The following will explain the desirable specific forms of the present invention.

(1) The address generating means has means for generating an address Xi+m (m=positive or negative integer), serving as an internal address, when X address Xe corresponding to the failure bit address and an address Xi greater than Xe are inputted from the external section.

(2) The address generating means has means for generating an address Xi, which is the same as an external address, serving as the internal address when address Xi including from X0 to Xe1−1 is inputted as the external address in a case where a plurality of failure bits are present in the memory cell array and the X address is Xej (j=1, 2, . . .) from lower bits, and generating an address Xi+j, formed by adding j to an external address, serving as an internal address when an address including from Xej−(j−1) to Xe(j+1)−(j+1) is inputted as the internal address.

(3) X address is a column address for selecting a bit line (or a row address for selecting a word line), and Y address is a row address (or a column address).

According to the second aspect of the present invention, there is provided a semiconductor memory device comprising a memory cell array having memory cells arranged in an array form in XY directions; storing means for storing X and Y addresses of failure bit memory cells; means for selecting either address X or address Y to be address-shifted in accordance with bias of the failure bits; and means for generating an address Xe+m or Ye+m (m=positive or negative integer), serving as an internal address, when the selected X address Xe or Y address Ye corresponding to the failure bit address is inputted from an external section. In this case, it is preferable that an address shift be negative.

According to the third aspect of the present invention, there is provided a semiconductor memory device comprising a memory cell array having memory cells arranged in an array form in at least an X direction; and an address converting circuit for arbitrarily defining a non-accessed internal X address when the X address inputted from an external section is converted to an internal X address.

The following will explain the desirable specific forms of the present invention.

(1) The semiconductor memory device further comprises means for storing a plurality of failure addresses, means for comparing the plurality of failure addresses and X address inputted from the external section in the number of address; and means for outputting failure addresses whose number is equal to or smaller than X address outputted from the external failure address. In this case, the address converting circuit includes means for adding the number of the failure addresses being equal to or smaller than the address inputted from the external section to the external address so as to generate the internal address. Also, the means for outputting failure addresses whose number is equal to or smaller than the X address outputted from the external failure address has means for storing one bit failure address.

(2) The address converting means has means for generating the internal X address stored in advance when the external address corresponding to the arbitrarily defined address is inputted in converting X address inputted from the external section to the internal X address. In this case, the semiconductor memory device further comprises means for storing a failure address; means for comparing an external address with the failure address; and means for outputting a pregiven internal address to an internal address bus when the external address is consistent with the failure address. Moreover, the failure address storing means includes fuses cut electrically or cut by a laser beam.

(3) The semiconductor memory device further comprises an internal address bus for changing either the external address or its detected and amplified address and an address internally generated to be transmitted. In this case, a logic bus width of the internal address bus is wider than that of the external address.

According to the present invention, means for storing the X address of the failure bit memory cell, and means for generating the internal address of Xe+m by the input of the failure bit address Xe are provided. As a result, the physical segment of the main memory cell array and the redundant memory cell array is not necessarily needed, and the access test of the redundant memory section can be performed similar to the main memory cell section. Due to this, the failure bit can be surely saved, and the save efficiency can be improved.

Moreover, according to the structure as described in the above item (1) in the first aspect, in the portion having the address more than the failure bit address, m bit address is shifted, and the failure bit can be saved by the simple calculation in which m bit is added in the condition of X>Xe.

Furthermore, as described in the above item (2) in the first aspect, when the X address having the plurality of failure bits is set to Xej (j=1, 2, ...) from the lower bits and address Xi including from X0 to Xel−1 is inputted as the external address, the internal address Xi+j in which j is added to the external address is generated as the internal address. Thereby, in the case of the plurality of failure bits, the failure bits can be easily saved.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a block diagram showing a basic structure of one embodiment of the present invention;

FIG. 5 is a block diagram showing a specific structure of the semiconductor memory device of the embodiment;

FIG. 10 is a block diagram showing a schematic structure of a semiconductor memory device of another embodiment;

FIG. 11 is a circuit diagram showing a failure address memory device and a failure address detecting circuit;

FIG. 12 is a circuit diagram showing an alternative address storing device and an alternative address output device; and FIG. 13 is a circuit diagram showing an external address unavailable circuit.

DETAILED DESCRIPTION OF THE PREFERRED EMBODIMENTS

Figure 1:
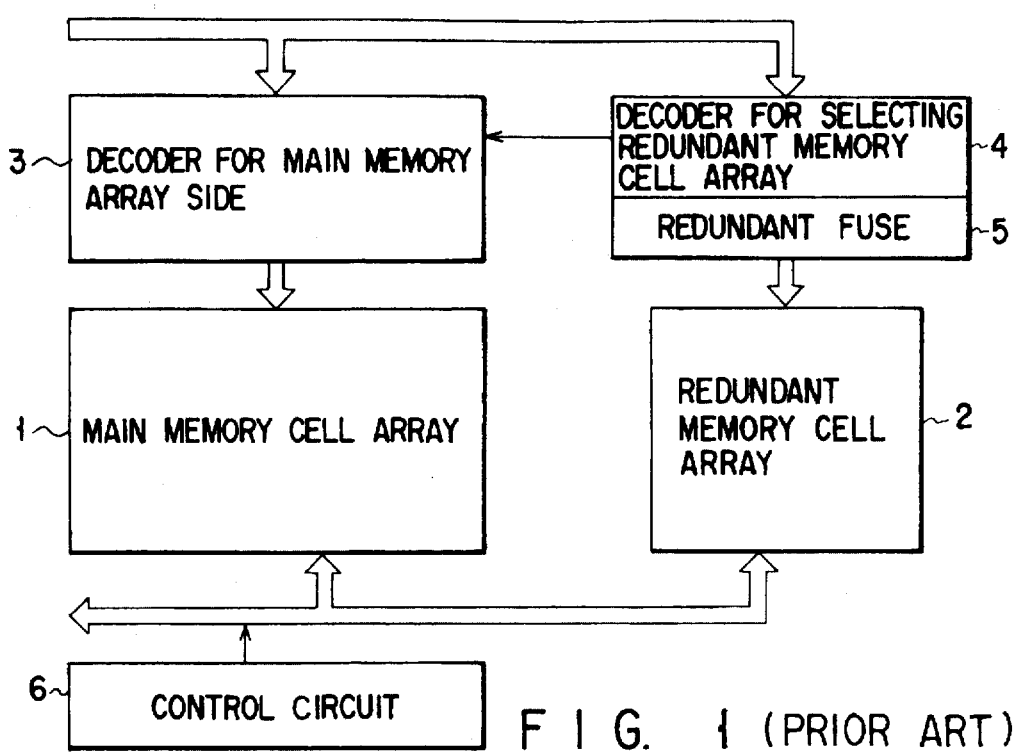
FIG. 1 is a block diagram showing a basic structure of a conventional semiconductor memory device.

An embodiment of the present invention will be explained with reference to the drawings. First, an outline of the embodiment of the present invention will be explained.

FIG. 2 is a block diagram showing a basic structure of one embodiment of the present invention. In FIG. 2, there are shown a failure bit address memory 11, an output bus 12 for a failure bit address, an external address bus 13, an address comparator 14 for comparing each address of the buses 12 and 13 with each other, an output bus 15 for the comparative result of the addresses, an internal address operator for preparing an internal address, an internal address bus 17 for outputting the prepared internal address, an X decoder 18, a memory cell array 19, a test mode detector 20, an output bus 21 for a test mode flag, and an external pin input signal 22.

Figure 3:
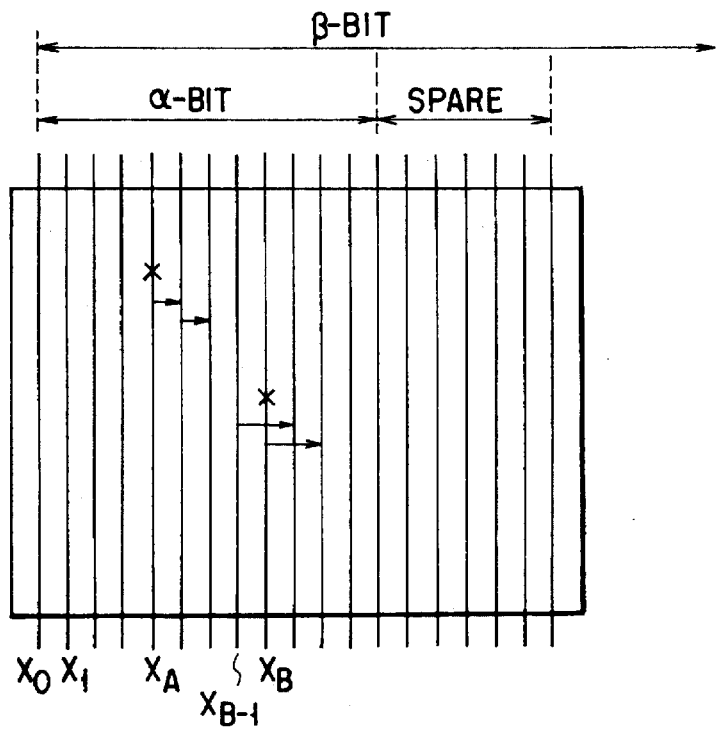
FIG. 3 is a view showing an address structure of a memory cell array used in the embodiment.

In the memory cell array 19 of this embodiment, an X address having $\alpha$ bit is externally used. An internal address is defined by $\beta$ bit ($\alpha+1$). More specifically, as shown in FIG. 3, in the memory cell array 19, there is a provided a spare for saving a failure bit in addition to the portion corresponding to the X address having $\alpha$ bit, which is originally needed. In this embodiment, a DRAM is used as the memory cell structuring the array 19.

In the above-mentioned structure, if an X address having $\alpha$ bit is inputted to the external address bus 13 from an external portion of a chip or a memory unit external portion of the same chip, the address is compared with an address output of the failure bit address memory 11 having $\beta$ bit ($\beta>\alpha$). More specifically, the X address is compared with a lower $\alpha$ bit of $\beta$ bit address. In the following explanation of the embodiment, $\beta=\alpha+1$ is set.

The following will explain a case that a number of failure bits is 1.

If the input address (external address) is inconsistent with a failure bit address in the lower n-bit, an unconsistent signal is outputted to the address comparator output but 15, and the same address data as the input address from the external address bus 13 is outputted to the internal address bus. Then, the address is inputted to the X decoder 18, and an X selection line corresponding to the address, such as a word line is selected.

On the other hand, if the input address is consistent with a failure bit address in the lower n-bit or the same as the failure bit address, or larger than the failure bit address, an address in which m is added to address of the external address bus 13 is generated from the address converter 16.

In this case, for example, m=1. As mentioned above, the failure bit is replaced with an address incremented by one.

Figure 4:
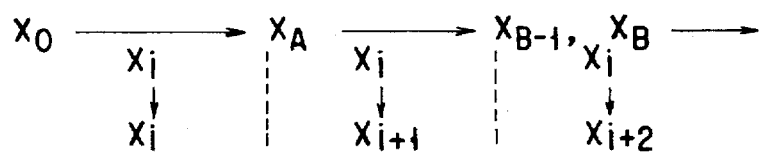
FIG. 4 is a view showing a state of an address shift to deal with a failure bit.

Regarding a case of a plurality of failure bits, the following will briefly explain a case in which 2 bit failures are address XA and address XB wherein XA<XB with reference to FIG. 4.

If the input Xi of the external address bus 13 is smaller than the input XA, the same data Xi as the external address bus 13 is outputted from the internal address bus 17. If the input Xi of the external address bus 13 is equal to XA or larger than XA and smaller than XB−1, a value Xi+1 to which "1" is added to data Xi of the external address bus 13 is outputted to the internal address bus 17. Also, if the input of the external address bus 13 is equal to XB−1 or larger than XB−1, a value Xi+2 to which "2" is added to data Xi of the external address bus 13 is outputted to the internal address bus 17. As mentioned-above, the failure bits are replaced. The state of the address shift is shown by an arrow of FIG. 3.

Similar to the above, in the case of three or more failure bits, if X address having failure bits is Xej (j=1, 2, ...) from the lower bit and the address Xi including from X0 to Xel−1 is inputted by the external address bus 13, the internal address Xi, which is the same as the external address, is generated in the internal address bus 17. If the address including from Xej−(j−1) to Xe(j+1)−(j+1) is inputted, an internal address Xi+j in which j is added to the external address is generated in the internal address 17. Thereby, j number of failure bits can be saved.

The following will explain a test mode of the present embodiment. In this embodiment, the test mode is set by a signal to the external pin or the combination of inputs to the external pin, and a test flag is activated.

The test mode is divided to two modes A and B. The test mode detector 20 detects two modes based on the input to the external pin or the combination of the inputs. The detected result is outputted to the output bus 21 of the test mode flag.

In mode A, data of the address bus 13 is directly outputted to the internal address bus 17. Thereby, the memory cell corresponding to α bit of FIG. 3 is accessed. In mode B, the most significant bit is set to 1, and data of address bus 13 as a lower address is outputted to the internal address bus 17. Thereby, the memory cell for a spare shown in FIG. 3 is accessed.

As explained above, in the test modes A and B, access to all cells of the memory cell array 19 can be performed. In other words, an access test can be performed regardless of the main memory cell section and the redundant memory cell section.

The following will specifically explain the embodiment of the semiconductor memory device of the present invention of FIG. 2.

As explained above, in the semiconductor memory device of the present invention, there are prepared the number of cells, which are larger than the number of addresses accessed from the external section, and the corresponding addresses regardless of the normal main memory cells and the redundant memory cell.

More specifically, among a plurality of memory elements, a part of the memory ailments is accessed from the external section to be used. As shown in FIG. 5, an address Am ($0 \leq Am \leq Amax$) is converted to an internal address Dm ($0 \leq Dm \leq Dmax$). At this time, the relationship of Amax<Dmax is established.

The address inputted from the external section is stored in an address buffer 23. The address memory device 11, which is the same as the failure bit address memory of FIG. 2, stores a non-access address among the internal addresses (failure bit address). As the address memory device 11, a fuse or a ROM may be used. The number of the address memory device 11 is one, and the failure bit address, which is stored in the ith ($0 \leq i \leq 1$) address memory 11, is Bi.

The address Am stored in the address buffer 23 is sent to the address comparator 14. The address comparator 14 compares the address Bi stored in the address memory device 11 with the external address Am stored in the address buffer 23. The comparative result is sent to the address converter 16 having the same function as the internal address operator of FIG. 2. The address converter 16 converts the external address Am to the internal address Dm based on the comparative result. At the time of the conversion, the external address Am is set to be prevented from being converted to the failure bit address Bi stored in the address memory device 11. According to the above-converted internal address, the memory elements of the memory cell array 1 decoded by the decoder 18 are accessed.

As a conversion of the external address Am to the internal address Dm, if the address Am inputted from the external section is more than ith, which is from the small failure bit address stored in the address memory device 11, and less than i+lth, it can be considered that i is added to the external address to obtain the internal address. The embodiment in which such a conversion is performed will be explained as follows.

Figure 6:
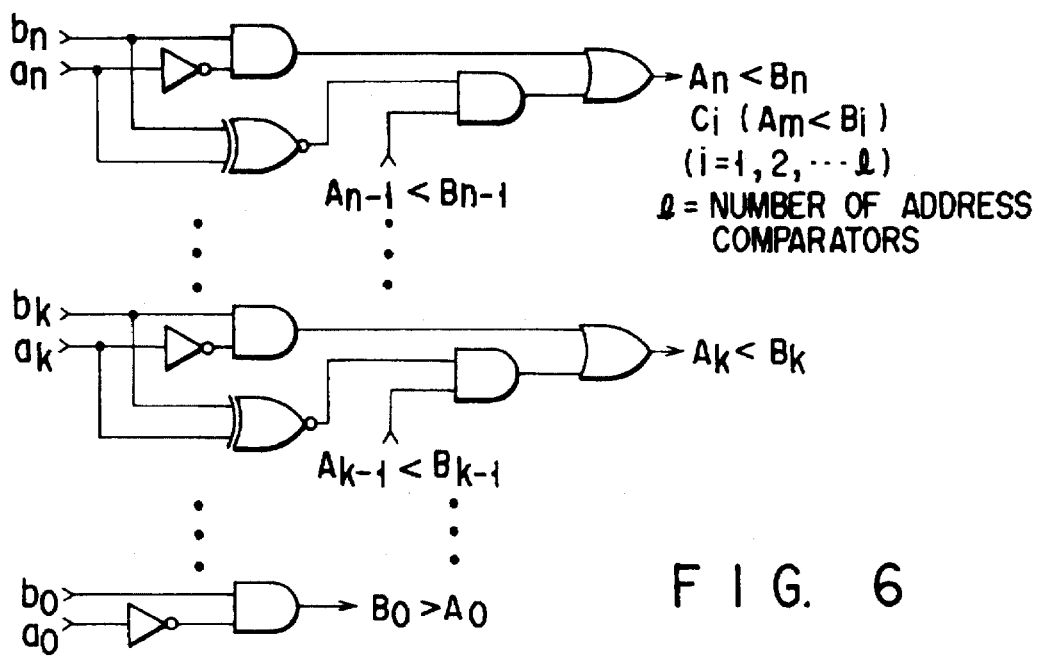
FIG. 6 is a circuit diagram showing an address comparator.

In the ith failure address memory device 11, ith failure bit address Bi is stored from the small bit. FIG. 6 shows the circuit structure of the address comparator 14. It is assumed that the address comparator 14 of FIG. 6 is ith ($0 \leq i \leq 1$), and Am inputted from the external section is n bit. Moreover, the kth digit of the failure bit address Bm and that of address Am inputted from the external section are bk and ak, respectively. Also, the lth to kth digits of the failure bit address Bm and those of the address Am inputted from the external section are Bk and Ak, respectively. The address comparator 14 compares the external address Am with the failure bit address Bi in the number of address.

Figure 7A:
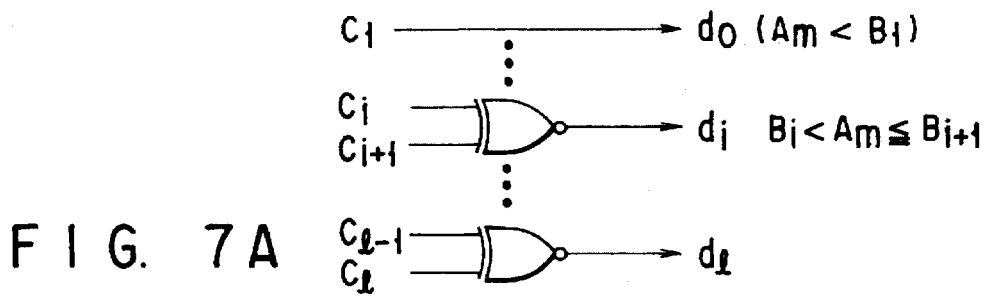
FIGS. 7A and 7B are circuit diagrams each showing an address converter.
Figure 7B:
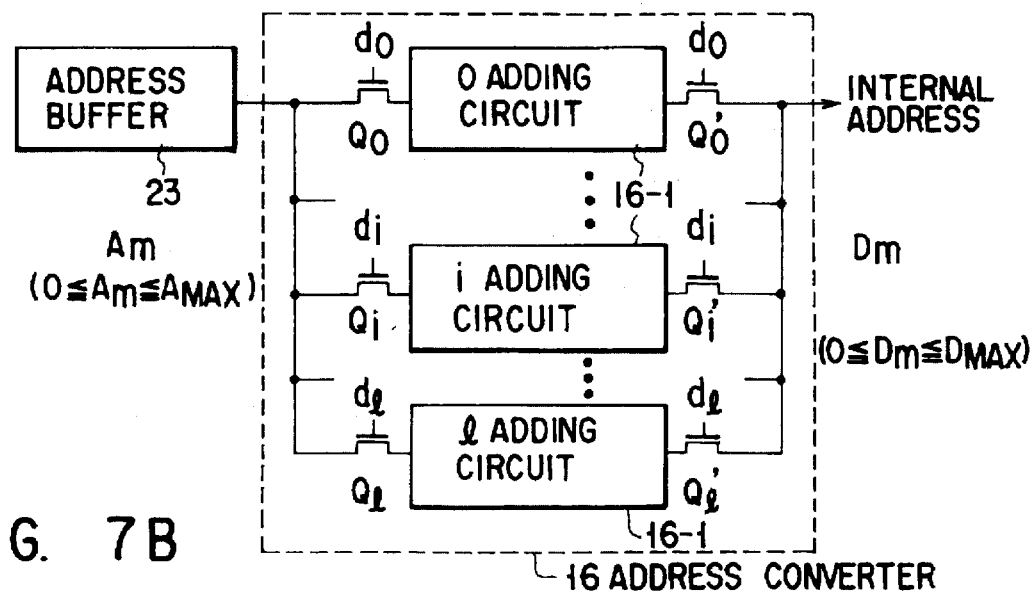

FIGS. 7A and 7B show the circuit structure of the address converter 16. Data di ($1 \leq i \leq 1$) serves as an EXNOR output of ci and that of ci+1. In this case, output of cl is directly inputted to d0. If Am<B1, only d0 is at an "H" level, and if $Bi \leq Am \leq Bi+1$, only di is at an "H" level.

As shown in FIG. 7B, data di ($0 \leq i \leq 1$) is inputted to a transfer gate Qi ($0 \leq i \leq 1$) for connecting the address buffer 23 to the adding circuit and a transfer gate Qi' ($0 \leq i \leq 1$) provided at the output side of an i adding circuit. The i adding circuit is a circuit for adding i as an input, and is formed of all general adders. Therefore, if the address Am inputted from the external section is more than ith, which is from the small failure bit address Bm and less than i+lth ($Bi \leq Am < Bi+1$), it is possible to perform a conversion in which i is added to the external address Am to obtain an internal address Dm.

The following will explain another embodiment in which there can be performed a conversion in which i is added to the external address to obtain the internal address if the address Am inputted from the external section is more than ith, which is from the small failure bit address stored in the failure address memory device 11, and less than i+lth.

Figure 8:
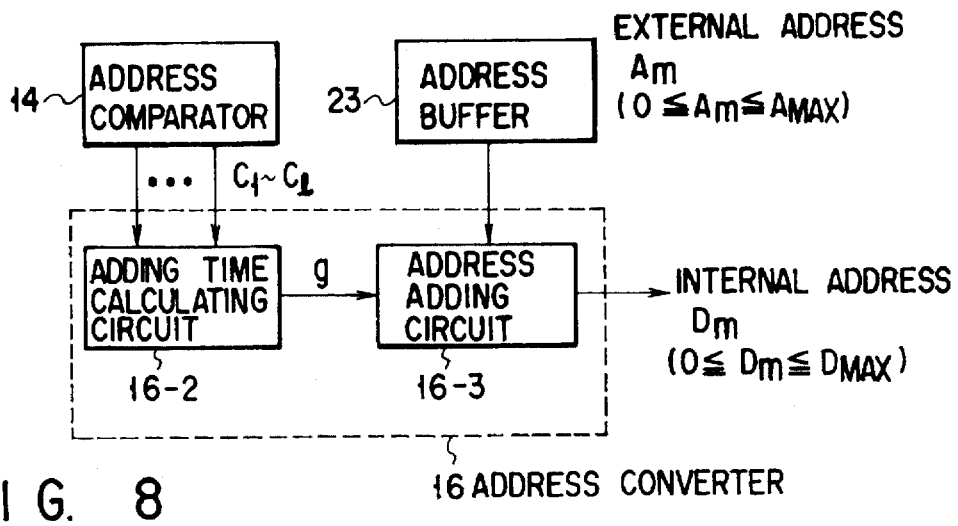
FIG. 8 is a block diagram showing the address converter.
Figure 9:
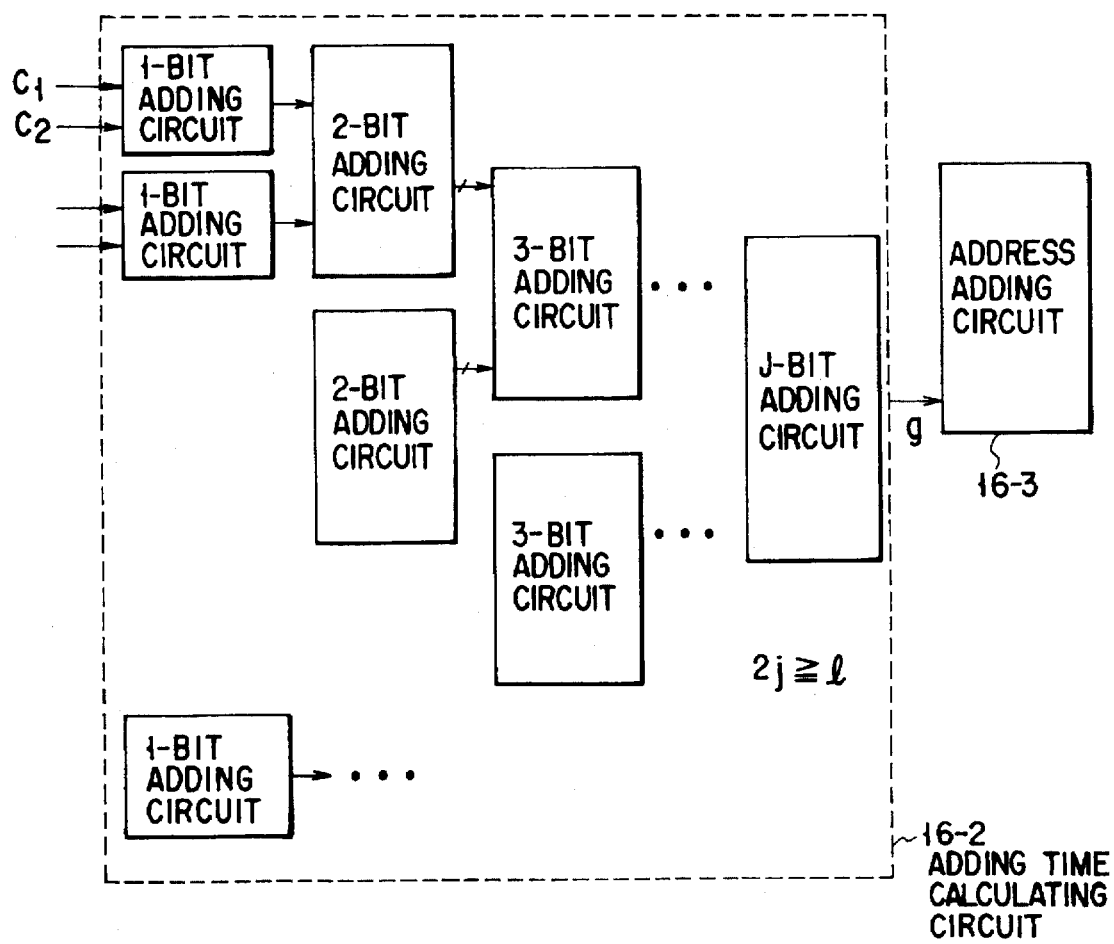
FIG. 9 is a block diagram showing an adding time calculating circuit.

According to this embodiment, failure bit address Bi may be inputted to the address memory device 11. Unlike the previous embodiment, the order of the failure bit address Bi may be irregular. Moreover, as the address memory device 11, the fuse or ROM may be used. In this embodiment, the same address comparator 14 as the previous embodiment is used. FIG. 8 is a block diagram showing the address converter 16. An output ci ($0 \leq i \leq 1$) of the address comparator 14 is inputted to an adding time calculating circuit 16-2. FIG. 9 is a block diagram showing the adding time calculating circuit 16-2.

The circuit is used to obtain the number of Bi such that the failure bit address Bi and the address Am inputted from the external section satisfy the relationship of Bi≦Am. Since the relationship of Bi≦Am is satisfied when the output ci of the address comparator 14 is in an "L" level, the number of B, which satisfies the relationship of Bi≦Am, can be obtained by adding an inverter output of ci. The addition is performed by repeating the operation in which data ci are added by two bits by two bits (as a pair), and the outputs are also added by two bits by two bits (as a pair). In the addition of the first stage, one bit addition may be used since the addition of the first stage is performed by one bit by one bit. Then, since the outputs are added by two bits by two bits, the two bit adder is needed in the next stage.

Then, if the addition is performed up to a stage j wherein $1 \leq 2j$, the number of Bi, which can satisfy the relationship of Bi≦Am, can be calculated. An address adding circuit 16-3 is used to add the output g to the address Am inputted to the address buffer 23 from the external section. An output of the address adding circuit 16-3 serves as an internal address Dm. Thereby, there can be performed the conversion in which i is added to the external address Am to obtain the internal address Dm if the address Am inputted from the external section is more than ith, which is from the small failure bit address Bm, and less than i+1th (Bi≦Am<Bi+1).

As compared with the previous embodiment, this embodiment has an advantage in which the order of the failure bit address Bi inputted to the address memory device 11 is irregular. By this advantage, flexibility of the memory device is increased, and for example, test time can be largely reduced. Moreover, even if one of the combinations of the address memory device 11 and the address comparator 14 is broken, the broken combination of the address memory device 11 and the address comparator 14 may not be used. Therefore, as compared with the previous embodiment in which all combinations of the address memory device 11 and the address comparator 14 must be operated, yield of chips can be improved.

Next, in the memory device in which the part of the memory elements among the plurality of memory elements is accessed from the external section, there can be considered the following conversion of the external address Am to the internal address Dm wherein the external address Am is prevented from being converted to the failure bit address.

More specifically, the failure bit address Bi and address Ei place of the failure bit address Bi are stored. At the time of accessing to Bi (Am=Bi ($0 \leq i \leq 1$)), the address is accessed to Ei (Dm=Ei), and the external address Am is used as the internal address (Dm=Am) at the other time (Am≠Bi ($0 \leq i \leq 1$)). The following will explain an embodiment in which the above conversion is performed.

FIG. 10 is a block diagram showing a schematic structure of a semiconductor memory device of another embodiment. The address Am ($0 \leq Am \leq Amax$) inputted from the external section is converted to the internal address Dm ($0 \leq Dm \leq Dmax$). At this time, this embodiment is the same as the above-mentioned embodiment in the point of Amax<Dmax.

The address inputted from the external section is stored in the address buffer 23. Reference numeral 11 is the address memory device for storing the non-access internal address, that is, failure bit address. As the address memory device 11, the fuse or the ROM may be used. The number of the address memory device 11 is one, and the failure bit address, which is stored in the ith ($0 \leq i \leq 1$) address memory 11, is Bi.

The address Am stored in the address buffer 23 is sent to a failure address detecting circuit 25. The number of outputs of ith failure address detecting circuit 25 is two. One is RON, which is inputted to an external address unavailable circuit 26, and the other is RONi, which is inputted to an ith alternative address output device 28. The ith failure address testing circuit 25 checks whether or not the address Bi stored in the ith address memory device 11 is consistent with the external address stored in the address buffer 23. If the address Bi is consistent with the external address, the external address unavailable circuit 26 is operated to make the external address unavailable through an output line. At the same time, an alternative address is outputted to the ith alternative address output device 28. The ith alternative address output device 28 outputs the address, serving as internal address Dm, stored in an ith alternative address storing device 27 by a signal of the ith address detecting circuit 25. According to the above converted internal address, the memory element 19 decoded by the decoder 18 is accessed.

FIG. 11 is a circuit diagram of an embodiment showing the ith failure address memory device 11 and the failure address detecting circuit 25. FIG. 12 is a circuit diagram of an embodiment showing the alternative address storing device 27 and the alternative address output device 28. FIG. 13 is a circuit diagram of an embodiment showing the external address unavailable circuit 26. In this embodiment, it is assumed that an address inputted from an external device is 14-bit, an address having any bit may be used.

In FIG. 11, F0, F0' to F13, F13' are fuses, which are used as failure address memory devices 11. These fuses are burned out by laser, so that the address is stored. For example, if (i+1)th bit ($0 \leq i \leq 13$) address is "1", Fi is burned out, and if (i+1)th bit ($0 \leq i \leq 13$) address is "0", Fi' is burned out.

Q0, Q0' to Q13, Q13' are n transistors, and external addresses (a0 to a13) and their complementary signals (/a0 to/a13) are inputted to the gate in order. The fuses F0 to F13' are connected to the sources, and their tip portions are grounded. The drain sides of the transistors Q0 to Q13' are connected to a common terminal/RONi. The common terminal/RONi is precharged to Vcc through a pMOS transistor Q14 by PR1. The common terminal/RONi is connected to a gate of an nMOS transistor Q16 through an nMOS transistor Q15 by a signal PR2 in a certain period of time after precharging. The drain side of the transistor Q16 is connected to a terminal RON, and the source side is grounded. The terminal RON is precharged to Vcc through a pMOS transistor Q17 by a signal PR1. Moreover, the common terminal/RONi is latched itself by two inverters.

Also, the common terminal/RONi is connected to RONi through an nMOS transistor Q18 by the signal PR2. RONi is precharged to Vss through the nMOS transistor Q17 by the signal PR1. Moreover, the RONi is latched itself by two inverters.

The operation is performed as follows.

First, before the address is inputted, the common terminal/RONi is precharged to "H" level, RON is precharged to "L" level, and "RONi is precharged to "L" level. If the address is inputted, and consistent with the address stored in the failure address memory device 11, /RONi is set to "L" level. If the address is inconsistent with the address stored in the failure address memory device 11, /RONi is maintained to be "H" level. Thereafter, the transistors Q15 and Q18 are turned on by the signal PR2. When /RONi is in "L," RON is maintained to be "H," and RONi is maintained to be "L." When /RONi is in "H," RON is set to "L," and RONi is set to "H."

F50 to F63 are fuses, which are used as alternative address storing devices 27. These fuses are burned out by laser, so that the address is stored. For example, if (i+1)th bit ($0 \leq i \leq 13$) address is "0", F (50+i) is burned out, and if (i+1)th bit ($0 \leq i \leq 13$) address is "1", F is not burned out.

One terminal of each of the fuses F50 to F63 is grounded, and the other terminals are connected to terminals e0 to e13, respectively. The terminals e0 to e13 are precharged to Vcc through pMOS transistors Q30 to Q43 by the signal PR1. Thereby, in only the case that the fuse F(50+i) is cut, the output of ei is set to "H," and the stored alternative address is outputted.

The terminals e0 to e13 are connected to the internal addresses d0 to d13 through nMOS transistors Q50 to Q63 each having RONi as a gate input. Also, the terminals a0 to a13 are connected to the internal addresses d0 to d13 through nMOS transistors Q70 to Q83 each having RON as a gate input.

If the address inputted by these circuits is consistent with the address stored in the failure address memory device 11, RON is set to "L," and RONi is set to "H." At this time, the external address Am is not outputted, and the alternative address Dm is outputted. If the address is inconsistent with the address stored in the failure address memory device 11, RON is set to "H," and RONi is set to "L." At this time, the external address Am is outputted, and the alternative address Dm is not outputted.

As mentioned above, when the failure bit address Bi and address Ei place of the failure bit address Bi are stored, and accessed to Bi (Am=Bi ($0 \leq i \leq 1$)), the address is accessed to Ei (Dm=Ei), and the external address Am can be used as the internal address (Dm=Am) at the other time (Am≠Bi ($0 \leq i \leq 1$)). Since the number of address bits is increased by one bit, the decoder becomes complicated as compared with the conventional decoder.

The present invention is not limited to the above embodiments.

In the above embodiments, the storing of the failure bit address of X address and the address shift were performed. The storing of the failure bit address of Y address and the address shift may be performed. X address or Y address may be selected by depending on whether the failure bit is biased to the X address side or the Y address side. In a case where the bias of the failure bit is not clear in advance, the functions of the failure bit address storing and the address shift are provided in connection with both X and Y addresses, and X or Y address may be selected according to the result of the actual testing.

The memory cell is not limited to DRAM. In other words, the other kinds, e.g., SRAM, EPROM, EEPROM can be used. Moreover, the various modifications can be made in the range without deviating the gist of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a memory cell array having memory cells arranged in an array form in XY directions;
   means for storing at least X addresses of failure bit memory cells among memory cells each defined by an X address and a Y address in said memory cell array; and
   address means for generating an address Xe+m (m=positive or negative integer), serving as an internal address, when an X address Xe corresponding to said failure bit address is inputted from an external section and for generating an address Xi+m (m=positive or negative integer), serving as an internal address, when X an address Xi greater than Xe is inputted from the external section.

2. A semiconductor memory device comprising:
   a memory cell array having memory cells arranged in an array form in XY directions;
   means for storing at least X address of failure bit memory cells among memory cells defined by X address and Y address in said memory cell array; and
   address means for generating an address Xe+m (m=positive or negative integer), serving as an internal address, when X address Xe corresponding to said failure bit address is inputted from an external section, wherein
   said address generating means has means for generating an address Xi, which is the same as an internal address, serving as the internal address when address Xi including from X0 to Xe1−1 is inputted as the external address in a case where a plurality of failure bits are present in said memory cell array and said X address is Xej (j=1, 2, . . . ) from lower bits, and generating an address Xi+j, formed by adding j to an external address, serving as an internal address when an address including from Xej−(j−1) to Xe(j+1)−(j+1) is inputted as the internal address.

3. A semiconductor memory device comprising:
   a memory cell array having memory cells arranged in an array form in XY directions;
   storing means for storing X and Y addresses of failure bit memory cells;
   means for selecting either address X or address Y to be address-shifted in accordance with bias of the failure bits; and
   means for generating an address Xe+m or Ye+m (m=positive or negative integer), serving as an internal address, when said selected X address Xe or Y address Ye corresponding to said failure bit address is inputted from an external section.

4. A semiconductor memory device comprising:
   a memory cell array having memory cells arranged in an array form in at least an X direction;
   an address converting circuit for arbitrarily defining a non-accessed internal X address when X address inputted from an external section is converted to an internal X address;
   means for storing a plurality of failure addresses;
   means for comparing said plurality of failure addresses and X address inputted from said external section; and means for outputting a number of failure addresses which is equal or smaller than X address inputted from said external section.

5. The semiconductor memory device according to claim 4, wherein said address converting circuit includes means for adding the number of the failure addresses being equal or smaller to/from the address inputted from said external section to the external address so as to generate the internal address.

6. The semiconductor memory device according to claim 4, wherein said means for outputting failure addresses whose number is equal or smaller to/than X address outputted from said external failure address has means for storing one bit failure address.

7. A semiconductor memory device comprising:
   a memory cell array having memory cells arranged in an array form in at least an X direction; and
   an address converting circuit for arbitrarily defining a non-accessed internal X address when an X address inputted from an external section is converted to an internal X address, wherein
   said address converting means has means for generating the internal X address stored in advance when the external address corresponding to the arbitrarily defined address is inputted in converting the X address inputted from the external section to the internal X address.

8. The semiconductor memory device according to claim 7, further comprising:
   means for storing a failure address;
   means for comparing an external address with said failure address; and
   means for outputting a pregiven internal address to an internal address bus when said external address is consistent with said failure address.

9. The semiconductor memory device according to claim 8, wherein said failure address storing means includes fuses cut electrically or cut by a laser beam.

10. A semiconductor memory device comprising:
    a memory cell array having memory cells arranged in an array form in at least an X direction;
    an address converting circuit for arbitrarily defining a non-accessed internal X address when an X address inputted from an external section is converted to an internal address; and
    an internal address bus for changing either the external address or its detected and amplified address and an address internally generated to be transmitted.

11. The semiconductor memory device according to claim 10, wherein a logic bus width of said internal address bus is wider than that of said external address.

12. The semiconductor memory device according to claim 10, further comprising:
    a programmable circuit for defining said non-accessed internal X address.

13. The semiconductor memory device according to claim 10, further comprising:
    a circuit for disenabling said address conversion according to an external signal.

14. The semiconductor memory device according to claim 11, further comprising:
    a programmable circuit for defining said non-accessed internal X address.

15. The semiconductor memory device according to claim 11, further comprising:
    a circuit for disenabling said address conversion according to an external signal.

* * * * *

UNITED STATES PATENT AND TRADEMARK OFFICE
CERTIFICATE OF CORRECTION

PATENT NO. : 5,684,746
DATED : November 4, 1997
INVENTOR(S) : Yukihito OOWAKI et al.

It is certified that error appears in the above-identified patent and that said Letters Patent is hereby corrected as shown below:

On the title page, Item [54], the title should read:

-- SEMICONDUCTOR MEMORY DEVICE IN WHICH A FAILED MEMORY CELL IS REPLACED WITH ANOTHER MEMORY CELL --

Signed and Sealed this

Twenty-fourth Day of February, 1998

Attest:

BRUCE LEHMAN

Attesting Officer

Commissioner of Patents and Trademarks